(12) United States Patent
Suzuki et al.

(10) Patent No.: US 7,749,664 B2
(45) Date of Patent: Jul. 6, 2010

(54) DYE-CONTAINING RESIST COMPOSITION AND COLOR FILTER USING SAME

(75) Inventors: Masayoshi Suzuki, Nei-gun (JP);
Kazuyoshi Hosaka, Nei-gun (JP);
Mariko Shudo, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 11/393,849

(22) Filed: Mar. 31, 2006

(65) Prior Publication Data

US 2006/0172206 A1    Aug. 3, 2006

Related U.S. Application Data

(62) Division of application No. 11/058,226, filed on Feb. 16, 2005.

(30) Foreign Application Priority Data

Feb. 23, 2004    (JP) ............... 2004-045784

(51) Int. Cl.
*G03F 1/00*      (2006.01)
*G02F 1/1335*    (2006.01)

(52) U.S. Cl. .......................................... 430/7

(58) Field of Classification Search ............ 430/270.1, 430/46.3, 7; 349/106
See application file for complete search history.

(56) References Cited

U.S. PATENT DOCUMENTS

| 5,482,804 | A | * | 1/1996 | Itoh et al. ............... 430/7 |
| 5,563,011 | A | * | 10/1996 | Shipley ................. 430/7 |
| 5,942,367 | A |   | 8/1999 | Watanabe et al. |
| 5,976,770 | A |   | 11/1999 | Sinta et al. |
| 6,312,869 | B1 |   | 11/2001 | Watanabe et al. |
| 6,461,791 | B1 |   | 10/2002 | Hatakeyama et al. |
| 6,509,125 | B1 | * | 1/2003 | Ito et al. ................. 430/7 |
| 6,541,179 | B2 |   | 4/2003 | Hatakeyama et al. |
| 6,645,281 | B2 | * | 11/2003 | Yabuki et al. .......... 106/31.27 |
| 2001/0018164 | A1 |   | 8/2001 | Furukawa |
| 2002/0045111 | A1 | * | 4/2002 | Machiguchi et al. ...... 430/7 |
| 2003/0232259 | A1 |   | 12/2003 | Araki |
| 2004/0192804 | A1 | * | 9/2004 | Kura et al. ................ 522/65 |
| 2005/0095530 | A1 |   | 5/2005 | Hosaka et al. |

FOREIGN PATENT DOCUMENTS

| JP | A 04-163552 | 6/1992 |
| JP | A 06-051514 | 2/1994 |

* cited by examiner

*Primary Examiner*—Cynthia H Kelly
*Assistant Examiner*—Connie P Johnson
(74) *Attorney, Agent, or Firm*—Oliff Berridge, PLC

(57) ABSTRACT

There is provided a color resist composition comprising a resin (A), a photoacid generator or a photobase generator (B), a crosslinking compound (C) and a dye mixture (D) containing a dye having a structure of amino sulfonate ester or ammonium sulfonate salt in a proportion of 40 to 95% by weight on total dye content. Preferably, resin (A) is polyvinyl phenol or a copolymer thereof, and the color resist composition has an optical quality having at least a region with a transmittance of 70% or more and a region with a transmittance of 10% or less in wavelength range between 400 nm and 700 nm, and in which a variation in transmittance is 5% or less even when the composition is subjected to a temperature of 200° C. or more. The color resist composition is applicable for color filters which exhibits a high spectrum reproducibility, a high light-resistance and a heat-resistance, and has a high resolution of 5 μm or less and no post development residue.

1 Claim, No Drawings

DYE-CONTAINING RESIST COMPOSITION AND COLOR FILTER USING SAME

This is a Division of Application No. 11/058,226 filed Feb. 16, 2005, which claims the benefit of Japanese Patent Application No. 2004-045784 filed Feb. 23, 2004. The disclosure of the prior applications are hereby incorporated by reference herein in their entireties.

BACKGROUND OF THE INVENTION

1. Field of the Invention

The present invention relates to a dye-containing resist composition and a color filter using the same.

2. Description of the Related Art

As color filters for image sensing devices such as a charge coupled device (CCD) or a liquid crystal display device (LCD), etc. make possible to form fine patterns and therefore make possible to produce highly fine color filters, they are mainly produced by using a method of forming a pattern with a photoresist to which coloring matters are added. In this method, a resist composition comprising a coloring matter and a polymer resin is used, and a color filter is produced by repeating the following process for each color, in which the process comprises coating the composition on a substrate to form a film, patterning the colored layer with a photolithographic process, and developing to form one colored pattern.

In the method, coloring matters used as colorant generally include pigments that are excellent in heat resistance and light resistance, and a resist in which a pigment is dispersed is proposed. For example, Japanese Patent Laid-open No. Hei 4-163552 discloses a photosensitive coloring resin composition characterized by comprising a resinous material curable with an acid, a photoacid generator and a pigment, in which the resinous material comprises a resin containing phenol and a crosslinking agent having N-methylol structure.

However, as the pigments itself contain particles having a particle diameter of some tens nm to some hundreds nm, they have problems that dispersion is not stabilized and the pigments cause foreign matters (particles). Therefore, this makes difficult to produce color filters for CCD for which a high resolution is required.

On the other hand, when dyes are used as coloring matter, the dyes give homogeneous compositions as the dyes are soluble in organic solvents. Therefore, resist compositions in which dyes are used enable formation of fine patterns compared with a resist composition in which pigments are dispersed. For example, Japanese Patent Laid-open No. Hei 6-51514 discloses a negative type resist composition containing a resin material curable with an acid, a crosslinking agent, a photoacid generator, a dye and a solvent.

SUMMARY OF THE INVENTION

When color filters in a shape of thinner film are requested, it is necessary to increase the concentration of dyes in resist compositions in order to realize a development of a prescribed color spectrum. An object of the present invention is to provide a color resist composition in which the concentration of dye is increased in order to respond to a tendency to make color filters thinner, thereby exhibiting a high spectrum reproducibility, a high light resistance and a heat resistance, and having a high resolution of 5 μm or less and no post development residue.

The present invention relates to the following aspects:
as a first aspect, a resist composition comprising a resin (A), a photoacid generator or a photobase generator (B), a crosslinking compound (C) and a dye mixture (D) containing a dye having a structure of amino sulfonate ester or ammonium sulfonate salt in a proportion of 40 to 95% by weight on total dye content;
as a second aspect, the resist composition described in the first aspect, wherein the resin (A) is polyvinyl phenol or a copolymer thereof;
as a third aspect, the resist composition described in the first or second aspect, which has an optical quality having at least a region with a transmittance of 70% or more and a region with a transmittance of 10% or less in wavelength range between 400 nm and 700 nm, and in which a variation in transmittance is 5% or less even when the composition is subjected to a temperature of 200° C. or more;
as a fourth aspect, the resist composition described in any one of the first to third aspects, which contains the dye mixture (D) in an amount of 55 to 95% by weight based on total solid content;
as a fifth aspect, the resist composition described in any one of the first to third aspects, which contains the dye mixture (D) in an amount of 55 to 90% by weight based on total solid content;
as a sixth aspect, the resist composition as described in any one of the first to fifth aspects, wherein the photoacid generator is a compound having a partial structure of formula (1):

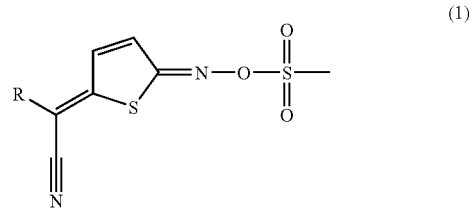

wherein R is an organic group;
as a seventh aspect, the resist composition as described in any one of the first to sixth aspects, wherein the resin (A) has a negative type property;
as an eighth aspect, the resist composition as described in any one of the first to sixth aspects, wherein the resin (A) has a positive type property;
as a ninth aspect, a method of producing a color filter comprising the steps of:
coating the resist composition as described in any one of the first to eighth aspects on a substrate;
drying;
exposing; and
developing;
as a tenth aspect, a liquid crystal display device having the color filter produced by the method as described in the ninth aspect;
as an eleventh aspect, a LED display device having the color filter produced by the method as described in the ninth aspect;
as a twelfth aspect, a solid-state image sensing device having the color filter produced by the method as described in the ninth aspect.

The present invention enables the concentration of dye to increase to 55% by weight or more based on total solid content in a resist composition so that the resist composition can respond to a tendency to make color filters thinner, and the present invention can improve heat resistance and light resistance. In addition, an interaction between dye and a phenolic resin can further improve heat resistance and light resistance. Further, a combination of a resin exhibiting a high alkaline developing property with a dye exhibiting an alkaline developing property makes possible to realize a development of a desired spectroscopic spectrum, and it can provide color filters excellent in heat resistance and light resistance and with a high resolution.

When a color filter is made from the resist composition of the present invention in which the concentration of dye is increased, it makes possible to make the color filter thinner. The concentration of dye in the resist composition is required to be 55% by weight or more for setting the film thickness of color filter to 0.3 to 1.5 µm. The resist composition containing the dye molecules and the color filter produced therefrom have an optical quality having at least a region with a transmittance of 70% or more and a region with a transmittance of 10% or less in wavelength range between 400 nm and 700 nm, which results from the dye molecules. In case where the above-mentioned transmittance is obtained in a low concentration of the dye, the number of the dye molecules per unit volume is reduced, but heat resistance and light resistance can not be sufficiently secured. On the other hand, in case where the above-mentioned transmittance is obtained in a high concentration of the dye, the number of the dye molecules per unit volume is increased, thus resolution and adhesiveness can not be sufficiently secured. Therefore, the present invention contains a dye having an optical quality having at least a region with a transmittance of 70% or more and a region with a transmittance of 10% or less in visible light range (wavelength range between 400 nm and 750 nm), particularly in 400 nm to 700 nm in an amount of 55 to 95% by weight, preferably 55 to 90% by weight based on total solid content in the resist composition. It is assumed that the combination of a dye mixture (D) having a structure of amino sulfonate ester or ammonium sulfonate salt in a proportion of 40 to 95% by weight on total dye content with a resin (A) being polyvinyl phenol or a copolymer thereof further improves compatibility and results in more preferable results. As a dye mixture (D) contains a dye having a structure of amino sulfonate ester or ammonium sulfonate salt in a proportion of 40 to 95% by weight based on total dyes in the resist composition, the dye mixture (D) can maintain as high as a content proportion of 55 to 95% by weight based on total solid content. When the proportion is less than 40% by weight, the dye mixture has a low compatibility, and therefore it is not preferable. On the other hand, when the proportion is more than 95% by weight, crystallizability of the dye molecules becomes high, the dye molecules are separated out as crystal in the resist composition and the crystal becomes a cause of foreign matters (particles), thereby it is not preferable.

Dyes such as red dye, green dye, blue dye or the like have a specific region in which each dye exhibits absorption (a region with transmittance of 10% or less) and a region without absorption (a region with transmittance of 70% or more). It is not preferable that the region without absorption inhibits any absorption of other dye. When each dye has any absorption in a region in which other dyes inherently have no absorption, it is insufficient in heat resistance and light resistance. The above-mentioned dye used in the present invention has a transmittance of 10% or less in a specific region with absorption and a transmittance of 70% or more in a region without absorption, realize a development of an intended spectroscopic spectrum and provides a clear color filter.

DETAILED DESCRIPTION OF THE PREFERRED EMBODIMENTS

The resist composition of the present invention can be applied for a negative type or a positive type ones by selecting the resin (A) to be used.

Hereinafter, the negative type resist composition will be described.

The resin (A) used in the negative type resist composition includes a resin curable with an acid generated by heat or light irradiation, a resin curable with a base generated by heat or light irradiation, and a photosensitive resin crosslinkable with heat or light irradiation. The resin is not specifically limited so long as an unexposed part of coating comprising the resin can be removed with a developer.

The resin (A) includes for example polyvinyl phenol or a copolymer thereof.

The copolymerizable monomer includes acrylic monomer and the like.

The (meth)acrylate includes methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylamino (meth)acrylate, hydroxyethyl (meth)acrylate, hydroxypropyl (meth)acrylate and glycidyl (meth)acrylate.

The ethylenic unsaturated carboxylic acid includes acrylic acid, methacrylic acid, crotonic acid, maleic acid, fumaric acid, itaconic acid, and acid anhydrides or half esters thereof. Among them, acrylic acid, methacrylic acid, maleic acid and hydroxypropyl (meth)acrylate are preferable The polyvinyl phenol or the copolymer thereof with the acrylic monomer have a weight average molecular weight of 1,000 to 100,000, and preferably 2,000 to 30,000 from the standpoint of performance of developing or adhesion. They may be used in a combination if necessary, and may be used a copolymer of vinyl phenol with an acrylic monomer or a copolymer of vinyl phenol with two or more acrylic monomers.

The other compound used for copolymerizing with vinyl phenol includes styrene derivative such as acrylic acid derivative, acrylonitrile, methacrylonitrile, styrene, α-methyl styrene, p-methyl styrene, o-methyl styrene, p-methoxy styrene and p-chloro styrene. Among them, styrene is preferable.

The polyvinyl phenol or the copolymer thereof, that is, polyhydroxy styrene or polyhydroxy styrene derivative has a weight average molecular weight of 1,000 to 100,000, and preferably 2,000 to 30,000 from the standpoint of performance of developing or adhesion. They may be used in a combination if necessary, and may be used alone or in a mixture of two or more.

The photoacid generator among the photoinitiator (B) used in case where resin (A) is used is not specifically limited so long as it generates an acid directly or indirectly with light irradiation. Concrete examples thereof include triazine compounds, acetophenone derivative compounds, disulfone compounds, diazomethane compounds, sulfonic acid derivative compounds, diaryliodonium salts, triaryl sulfonium salts, triaryl phosphonium salts and iron arene complex, etc. to which the present invention is not limited. Further concretely, the photoacid generator includes the following compounds: diphenyliodonium chloride, diphenyliodonium trifluoromethane sulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoro arsenate, bis(p-tert-butylphenyl) iodonium hexafluorophosphate, bis(p-tert-butylphenyl) iodonium mesylate, bis(p-tert-butylphenyl)iodonium tosylate, bis(p-tert-butylphenyl) iodonium trifluoromethane sulfonate, bis(p-tert-butylphenyl) iodonium tetrafluoroborate, bis(p-tert-butylphenyl) iodonium chloride, bis(p-chlorophenyl) iodonium chloride, bis(p-chlorophenyl) iodonium tetrafluoroborate, triphenylsulfonium chloride, triphenyl sulfonium bromide, tri(p-methoxyphenyl) sulfonium tetrafluoroborate, tri(p-methoxyphenyl) sulfonium hexafluoro phosphonate, tri(p-ethoxyphenyl) sulfonium tetrafluoroborate, triphenylphosphonium chloride, triphenylphosphonium bromide, tri(p-methoxyphenyl) phosphonium tetrafluoroborate, tri(p-methoxyphenyl) phosphonium hexafluorophosphonate, tri(p-ethoxyphenyl) phosphonium tetrafluoroborate.

In addition, the photoacid generators represented by formulae (2) to (68) can be used.

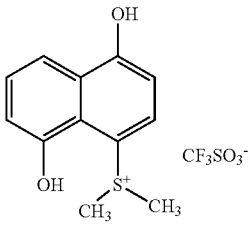
(2)

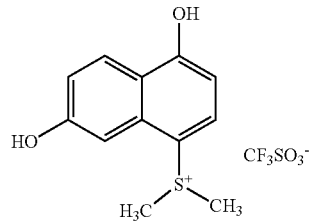
(3)

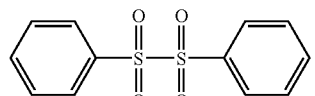
(4)

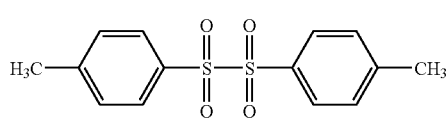
(5)

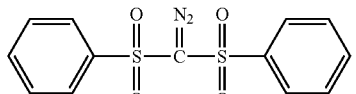
(6)

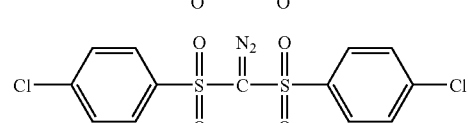
(7)

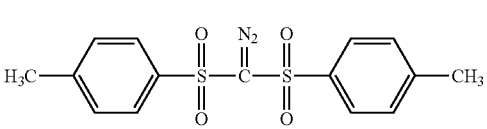
(8)

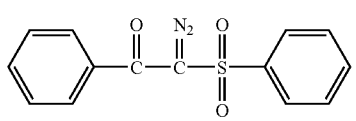
(9)

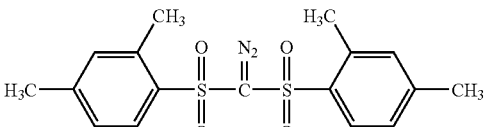
(10)

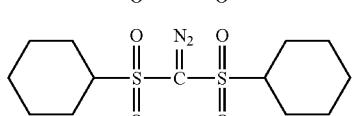
(11)

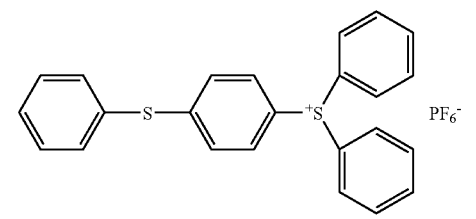

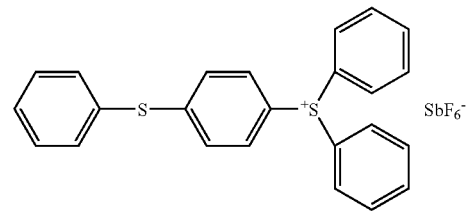
(12)

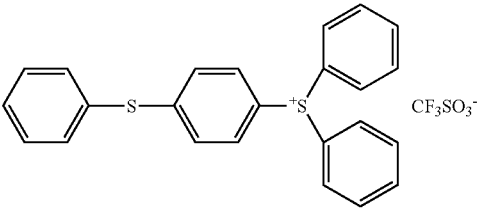
(13)

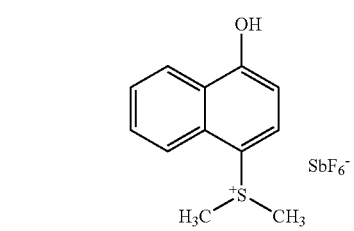
(14)

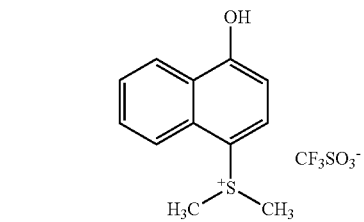
(15)

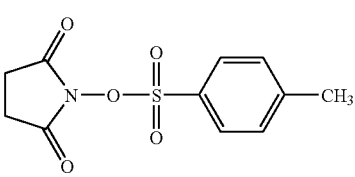
(16)

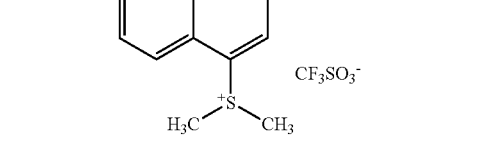
(17)

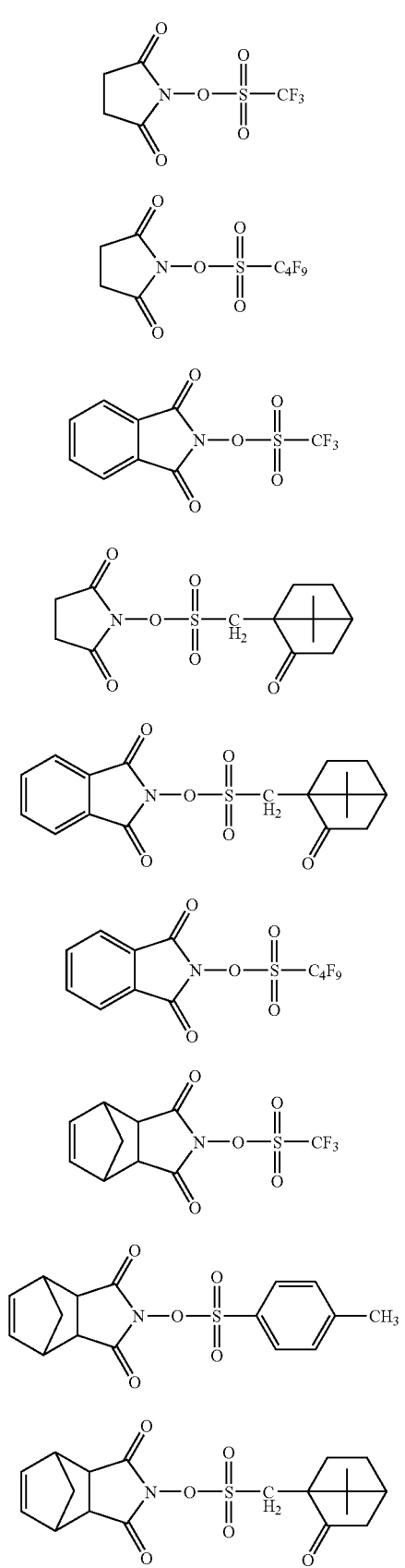
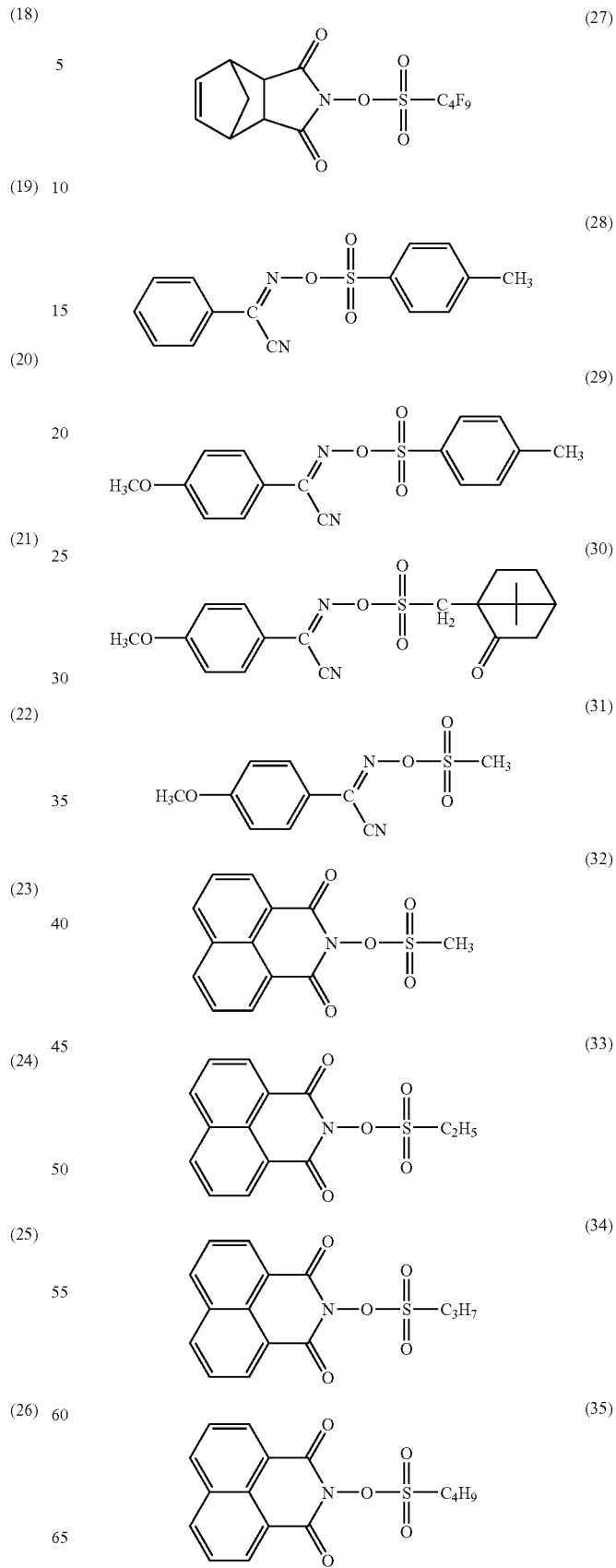

-continued
(36)
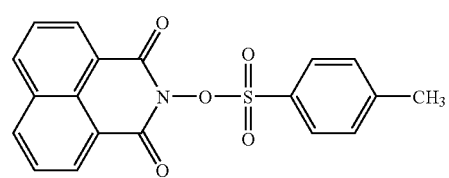
(37)
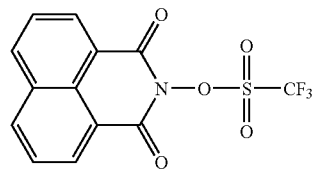
(38)
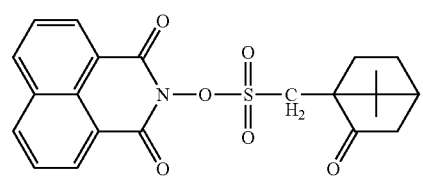
(39)
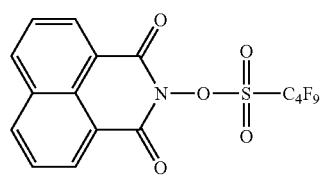
(40)
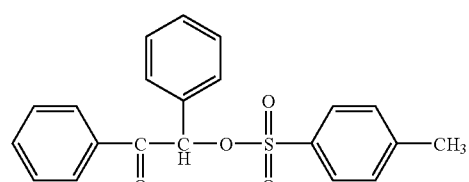
(41)
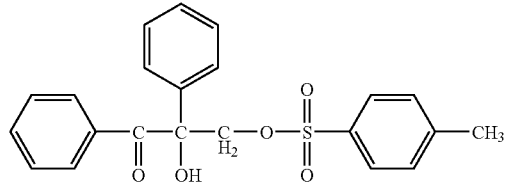
(42)
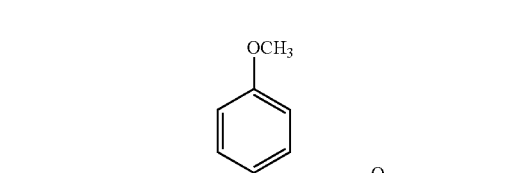
(43)
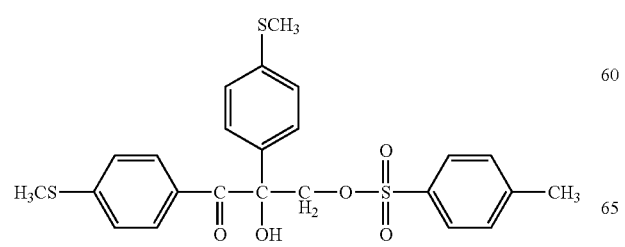
-continued
(44)
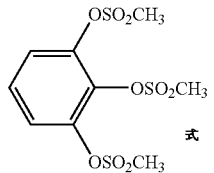
(45)
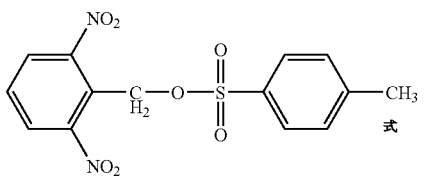
(46)
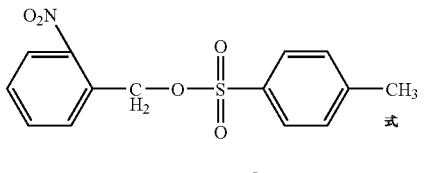
(47)
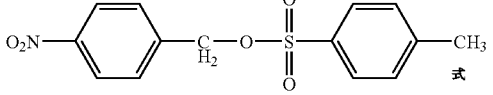
(48)
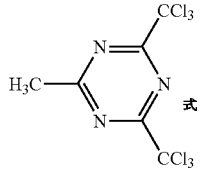
(49)
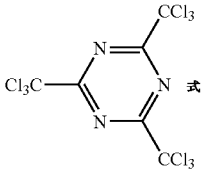
(50)
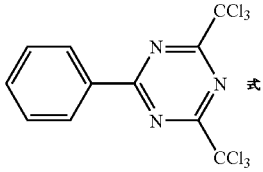
(51)
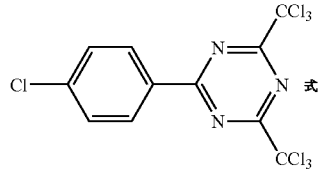
(52)
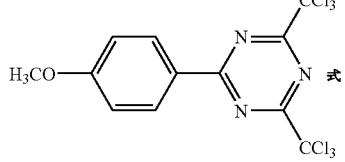

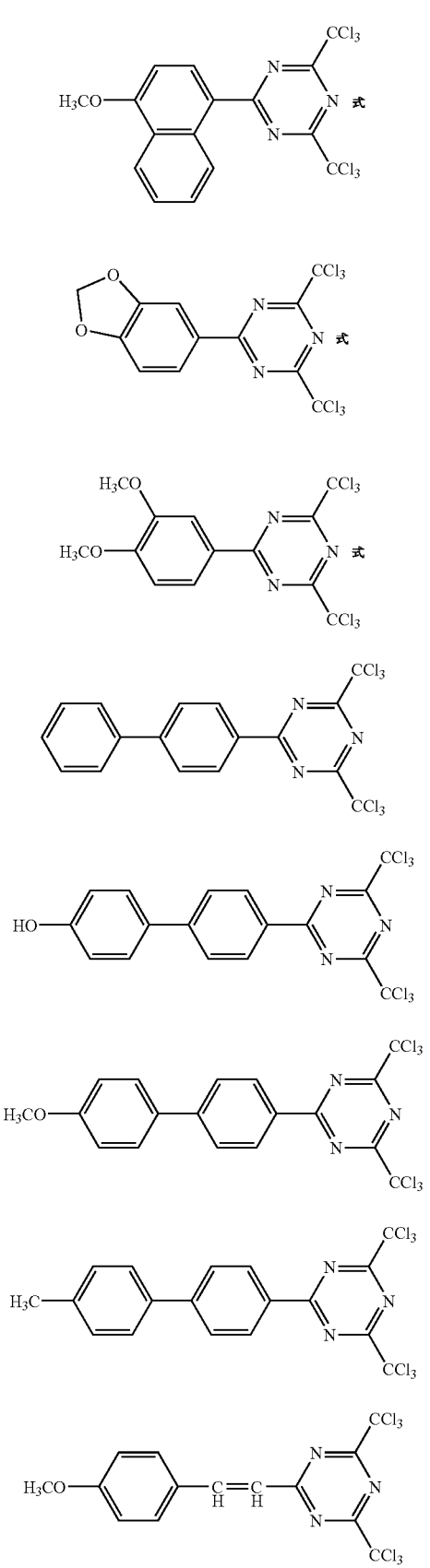
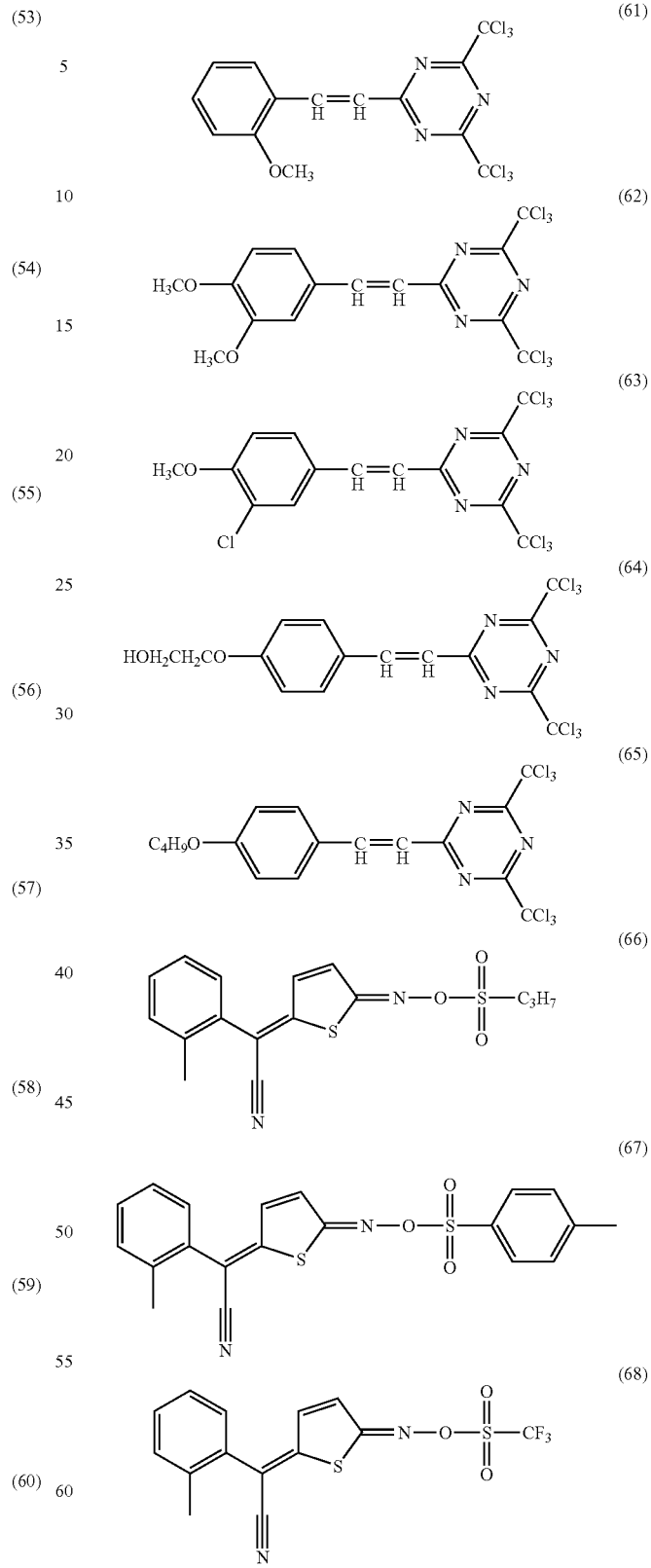
The photoacid generator includes a compound having a partial structure of formula (1). In formula (1), R is an organic group, for example groups of substituted or unsubstituted aliphatic and aromatic hydrocarbons. The groups of aromatic hydrocarbons such as phenyl, tolyl, benzyl, naphthyl or the like are preferably used. For example, resist compounds in which the compounds of formulae (66) to (68) are used provide clearer resist pattern.

These photoacid generators are merely exemplified, and the present invention is limited thereto.

These photoacid generators may be used alone or in a combination of two or more. The amount to be introduced is selected from a range of 1 to 300 parts by weight, preferably 2 to 100 parts by weight based on 100 parts by weight of resin (A) component. When the amount is less than 1 part by weight, crosslink reaction does not fully proceed, and it becomes difficult to obtain a desired resist pattern. On the other hand, when the amount is more than 300 parts by weight, the resist composition has a low shelf stability. Therefore, the amount of the photoacid generator to be introduced is preferably 1 to 300 parts by weight based on 100 parts by weight of resin (A) component.

The photobase generator is not specifically limited so long as it generates a base directly or indirectly with light irradiation. The photobase generator includes for example bis[[(2-nitrobenzyl) oxy] carbonylhexane-1,6-diamine], nitrobenzyl cyclohexyl carbamate, di(methoxybenzyl) hexamethylene dicarbamate and the compounds of formulae (69) to (71).

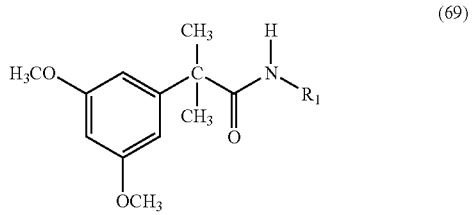

(69)

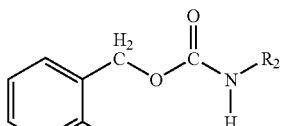

(70)

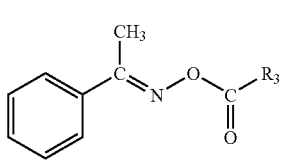

(71)

In these formulae (69) to (71), $R_1$, $R_2$ and $R_3$ are hydrogen atom, a substituted or unsubstituted alkyl, or a substituted or unsubstituted phenyl.

These photobase generators may be used alone or in a combination of two or more similarly to the photoacid generators. The amount to be introduced is preferably 1 to 300 parts by weight, preferably 2 to 100 parts by weight based on 100 parts by weight of resin (A) component from the same reason as the above-mentioned one.

Further, as photosensitizer, prior known photosensitizers may be used. The photosensitizer includes for example thioxanthenes, xanthenes, ketones, thiopyrylium salts, basestyryls, merocyanines, 3-substituted coumarins, 3,4-subsituted coumarins, cyanines, acridines, thiazines, phenothiazines, anthracenes, coronenes, benzanthracenes, perylenes, ketocoumarines, fumarines and borates. These may be used alone or in a combination of two or more.

The crosslinking compound (C) used along with resin (A) in the negative type resist composition is not specifically limited so long as it is a compound having at least one crosslink-forming group selected from the group consisting of hydroxy, hydroxyalkyl and lower alkoxyalkyl.

The crosslinking compound includes for example amino resins having hydroxy or alkoxy, such as melamine resins, urea resins, guanamine resins, glycoluril-formaldehyde resins, succinylamide-formaldehyde resins and ethylene urea-formaldehyde resins.

For example, the crosslinking compound (C) may be melamine derivatives, benzoguanamine derivatives or glycolurils in which a hydrogen atom of the amino group is substituted with a methylol or an alkoxymethyl or both of them. The melamine derivatives and benzoguanamine derivatives may be present in a dimer or trimer. These preferably have on average three to six methylol or alkoxymethyl groups per triazine ring.

The melamine derivatives and benzoguanamine derivatives include for example commercially available products, such as MX-750 having on average 3.7 substituted methoxymethyl groups per triazine ring, MW-30 having on average 5.8 substituted methoxymethyl groups per triazine ring (the above-mentioned two products are manufactured by Sanwa Chemical Co., Ltd.), or methoxymethylated melamines such as Cymel 300, 301, 303, 350, 370, 771, 325, 327, 703 or 712, methoxymethylated butoxymethylated melamines such as Cymel 235, 236, 238, 212, 253 or 254, butoxymethylated melamines such as cymel 506, or 508, carboxy-containing methoxymethylated isobutoxymethylated melamines such as Cymel 1141, methoxymethylated ethoxymethylated benzoguanamines such as Cymel 1123, methoxymethylated butoxymethylated benzoguanamines such as Cymel 1123-10, butoxymethylated benzoguanamines such as Cymel 1128, carboxy-containing methoxymethylated ethoxymethylated benzoguanamines such as Cymel 1125-80 (the above-mentioned products are manufactured by Mitsui Cytec Co., Ltd.). In addition, glycolurils include for example butoxymethylated glycolurils such as Cymel 1170, methylol glycolurils such as Cymel 1172, or methoxymethylol glycolurils such as Powderlink 1174.

In addition, benzene or phenol compounds having hydroxy or alkoxy group include for example 1,3,5-tris(methoxymethoxy) benzene, 1,2,4-tris(isopropoxymethoxy) benzene, 1,4-bis(sec-butoxymethoxy) benzene, 2,6-dihydroxymethyl-p-tert-butylphenol and the like.

Further, compounds containing epoxy or isocyanate group and having crosslink-forming group may be used. Concrete examples include for example bisphenolacetone glycidyl ether, phenol novolak epoxy resin, cresol novolak epoxy resin, triglycidyl isocyanurate, tetraglycidyl aminodiphenylene, tetraglycidyl-m-xylene diamine, tetraglycidyl-1,3-bis(aminoethyl) cyclohexane, tetraphenylglycidyl ether ethane, triphenylglycidyl ether ethane, bisphenol hexafluoroacetodiglycidyl ether, 1,3-bis(1-(2,3-epoxypropoxy)-1-trifluoromethyl-2,2,2-trifluoromethyl) benzene, 4,4-bis(2,3-epoxypropoxy) octafluorobiphenyl, triglycidyl-p-aminophenol, tetraglycidylmetaxylene diamine, 2-(4-(2,3-epoxypropoxy) phenyl)-2-(4-(1,1-bis(4-(2,3-epoxypropoxy) phenyl) ethyl) phenyl) propane, 1,3-bis(4-(1-(4-(2,3-epoxypropoxy) phenyl-1-(4-(l-(4-(2,3-epoxypropoxyphenyl)-1-methylethyl) phenyl) ethyl) phenoxy)-2-propanol and the like.

These crosslinking compounds (C) may be used alone or in a combination of two or more. The amount to be introduced is selected from a range of 1 to 300 parts by weight, preferably 20 to 200 parts by weight based on 100 parts by weight of resin (A) component. When the amount is less than 1 part by weight, crosslink reaction does not fully proceed, and it becomes difficult to obtain a desired resist pattern. On the other hand, when the amount is more than 300 parts by weight, the resist composition has a low shelf stability. Therefore, the amount of the crosslinking compound to be introduced is preferably 1 to 300 parts by weight based on 100 parts by weight of resin component.

Dye components used in the negative type resist composition of the present invention are compounds which have a spectrum desirable for color filter and which dissolve in a solvent as such or dissolves therein in a shape of a modified dye. These dyes include acid dyes, oil-soluble dyes, disperse dye, reactive dyes and direct dyes, etc. For example, the dyes are azo dyes, benzoquinone dyes, naphthoquinone dyes, anthraquinone dyes, cyanine dyes, squarilium dyes, croconium dyes, melocyanine dyes, stilbene dyes, diphenylmethane dyes, triphenylmethane dyes, fluororane dyes, spiropyran dyes, phthalocyanine dyes, indigo dyes, flugide dyes, nickel complex dyes and azulene dyes. Concretely, the dyes include the following ones in term of color index number: C. I. Solvent Yellow 2, 3, 7, 12, 13, 14, 16, 18, 19, 21, 25, 25: 1, 27, 28, 29, 30, 33, 34, 36, 42, 43, 44, 47, 56, 62, 72, 73, 77, 79, 81, 82, 83, 83:1, 88, 89, 90, 93, 94, 96, 98, 104, 107, 114, 116, 117, 124, 130, 131, 133, 135, 141, 143, 145, 146, 157, 160:1, 161, 162, 163, 167, 169, 172, 174, 175, 176, 179, 180, 181, 182, 183, 184, 185, 186, 187, 189, 190, 191, C. I. Solvent Orange 1, 2, 3, 4, 5, 7, 11, 14, 20, 23, 25, 31, 40:1, 41, 45, 54, 56, 58, 60, 62, 63, 70, 75, 77, 80, 81, 86, 99, 102, 103, 105, 106, 107, 108, 109, 110, 111, 112, 113, C. I. Solvent Red 1, 2, 3, 4, 8, 16, 17, 18, 19, 23, 24, 25, 26, 27, 30, 33, 35, 41, 43, 45, 48, 49, 52, 68, 69, 72, 73, 83:1, 84:1, 89, 90, 90:1, 91, 92, 106, 109, 110, 118, 119, 122, 124, 125, 127, 130, 132, 135, 141, 143, 145, 146, 149, 150, 151, 155, 160, 161, 164, 164:1, 165, 166, 168, 169, 172, 175, 179, 180, 181, 182, 195, 196, 197, 198, 207, 208, 210, 212, 214, 215, 218, 222, 223, 225, 227, 229, 230, 233, 234, 235, 236, 238, 239, 240, 241, 242, 243, 244, 245, 247, 248, C. I. Solvent Violet 2, 8, 9, 11, 13, 14, 21, 21:1, 26, 31, 36, 37, 38, 45, 46, 47, 48, 49, 50, 51, 55, 56, 57, 58, 59, 60, 61, C. I. Solvent Blue 2, 3, 4, 5, 7, 18, 25, 26, 35, 36, 37, 38, 43, 44, 45, 48, 51, 58, 59, 59:1, 63, 64, 67, 68, 69, 70, 78, 79, 83, 94, 97, 98, 100, 101, 102, 104, 105, 111, 112, 122, 124, 128, 129, 132, 136, 137, 138, 139, 143, C. I. Solvent Green 1, 3, 4, 5, 7, 28, 29, 32, 33, 34, 35, C. I. Solvent Brown 1, 3, 4, 5, 12, 20, 22, 28, 38,41, 42, 43, 44, 52, 53, 59, 60, 61, 62, 63, C. I. Solvent Black 3, 5, 5:2, 7, 13, 22, 22:1, 26, 27, 28, 29, 34, 35, 43, 45, 46, 48, 49, 50, C. I. Acid Red 6, 11, 26, 60, 88, 111, 186, 215, C. I. Acid Green 25, 27, C. I. Acid Blue 22, 25, 40, 78, 92, 113, 129, 167, 230, C. I. Acid Yellow 17, 23, 25, 36, 38, 42, 44, 72, 78, C. I. Basic Red 1, 2, 13, 14, 22, 27, 29, 39, C. I. Basic Green 3, 4, C. I. Basic Blue 3, 9, 41, 66, C. I. Basic Violet 1, 3, 18, 39, 66, C. I. Basic Yellow 11, 23, 25, 28, 41, C. I. Direct Red 4, 23, 31, 75, 76, 79, 80, 81, 83, 84, 149, 224, C. I. Direct Green 26, 28, C. I. Direct Blue 71, 78, 98, 106, 108, 192, 201, C. I. Direct Violet 51, C. I. Direct Yellow 26, 27, 28, 33, 44, 50, 86, 142, C. I. Direct Orange 26, 29, 34, 37, 72, C. I. Sulphur Red 5, 6, 7, C. I. Sulphur Green 2, 3, 6, C. I. Sulphur Blue 2, 3, 7, 9, 13, 15, C. I. Sulphur Violet 2, 3, 4, C. I. Sulphur Yellow 4, C. I. Vat Red 13, 21, 23, 28, 29, 48, C. 1. Vat Green 3, 5, 8, C. I. Vat Blue 6, 14, 26, 30, C. I. Vat Violet 1, 3, 9, 13, 15, 16, C. I. Vat Yellow 2, 12, 20, 33, C. I. Vat Orange 2, 5, 11, 15, 18, 20, C. I. Azoic Coupling Component 2, 3, 4, 5, 7, 8, 9, 10, 11, 13, 32, 37, 41, 48, C. I. Reactive Red 8, 22, 46, 120, C. I. Reactive Blue 1, 2, 7, 19, C. I. Reactive Violet 2, 4, C. I. Reactive Yellow 1, 2, 4, 14, 16, C. I. Reactive Orange 1, 4, 7, 13, 16, 20, C. I. Disperse Red 4, 11, 54, 55, 58, 65, 73, 127, 129, 141, 196, 210, 229, 354, 356, C. I. Disperse Blue 3, 24, 79, 82, 87, 106, 125, 165, 183, C. I. Disperse Violet 1, 6, 12, 26, 27, 28, C. I. Disperse Yellow 3, 4, 5, 7, 23, 33, 42, 60, 64, C. I. Disperse Orange 13, 29, 30. These dyes are used in a dye mixture containing a dye having a structure of amino sulfonate ester or ammonium sulfonate salt in a proportion of 40 to 95% by weight based on total dyes content in order to realize photolithography properties or desired spectral properties. The dye mixture for developing RGB contains amino sulfonate ester or ammonium sulfonate salt in a proportion of 40 to 95% by weight on total dye content and impurities originating from the dye molecules and other dyes mentioned above in a proportion of remaining 5 to 60% by weight.

When the proportion of amino sulfonate ester or ammonium sulfonate salt in the dye mixture is less than 40% by weight based on total dyes content, the dye mixture is poor in solubility in the resist composition, and therefore it is not preferable. On the other hand, when the proportion is more than 95% by weight on total dye content, crystallizability of the dye molecules becomes high, the dye molecules are separated out as crystal in the resist composition and the crystal becomes a cause of foreign matters (particles), thereby it is not preferable.

Amino sulfonate ester is represented by formula (72) or (73):

$$—SO_2—NH— \quad (72)$$

$$—SO_2—N(—SO_2—)— \quad (73)$$

It is preferable that dyes have the structure of amino sulfonate ester represented by formula (72) in the molecule from the viewpoint of solubility.

In addition, ammonium sulfonate is represented by $SO_3^- N(R')_4^+$ wherein R' is a hydrogen atom or alkyl.

Representative dye components having a structure of amino sulfonate ester or ammonium sulfonate salt in the molecule include the following.

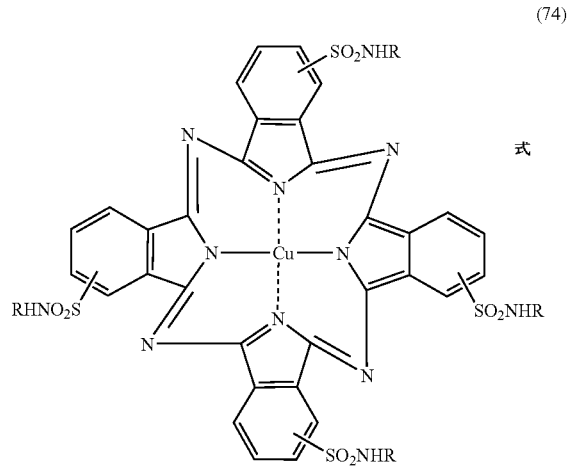

(74)

(75)

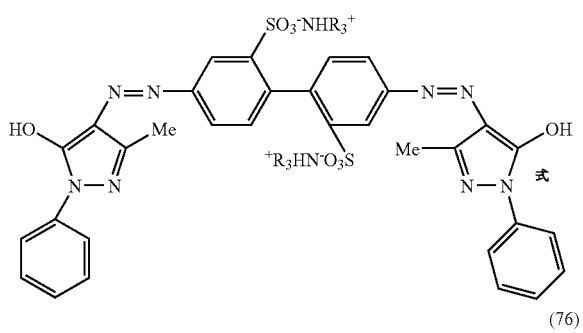

(76)

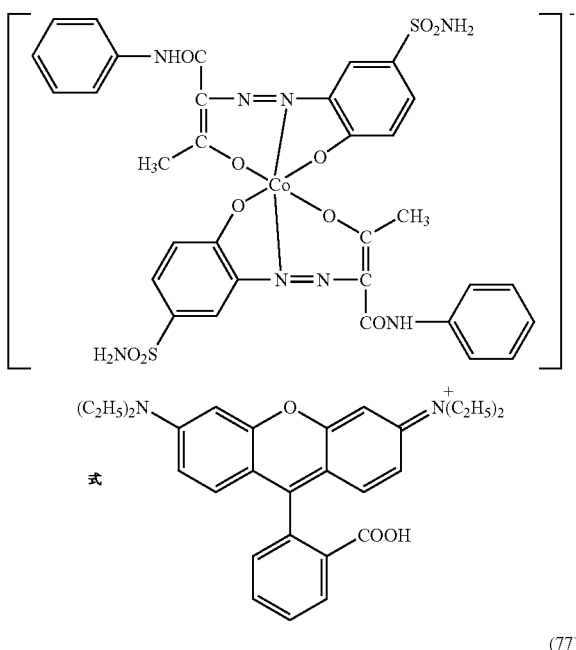

(77)

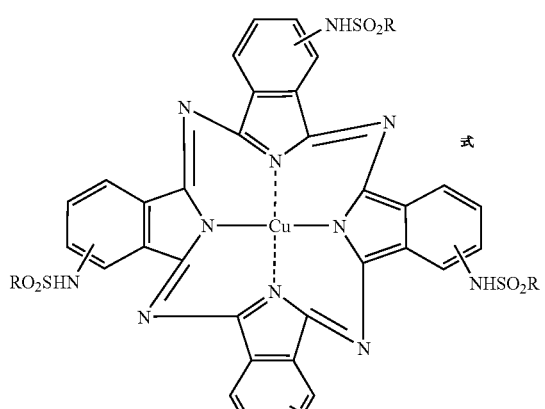

(78)

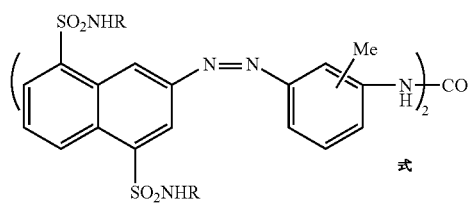

(79)

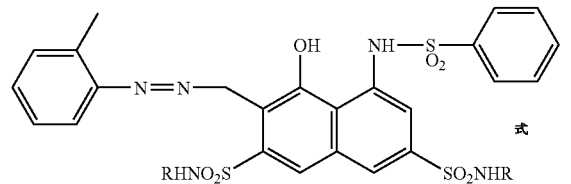

wherein R is an alkyl with 1-12 carbon atoms, or an aromatic group, such as phenyl or naphthyl, etc.

Dye mixture (D) has an optical quality having at least a region with a transmittance of 70% or more and a region with a transmittance of 10% or less in wavelength range between 400 nm and 700 nm, and a variation in transmittance of 5% or less even when it is subjected to a temperature of 200° C. or more. Further, the resist composition and the color filter produced therefrom also have similar optical quality.

The resist composition of the present invention is coated on a substrate, and then baked (calcined) at a temperature of 50 to 150° C., exposed to light and developed. Even when the baking is carried out at a high temperature of 200 to 270° C. (for 30 minutes at 200° C., and for 30 seconds at 270° C.), a variation in transmittance at the part exhibiting transmittance of 70% or more at wavelength range of 400 to 700 nm is 5% or less compared with that before baking.

In the negative type resist composition, the amount of dye mixture (D) to be introduced is selected from a range of 55 to 95% by weight, preferably 55 to 90% by weight based on total solid content (100% by weight) of resin (A), photoacid generator or photobase generator (B), crosslinking compound (C) and dye mixture (D). When the dye mixture is introduced in a small amount, it becomes difficult to realize desired spectral properties when resist coating is formed in a shape of thin film. On the other hand, when the dye mixture is introduced in a large amount, the resist composition has a low shelf stability.

In the positive type resist composition, the amount of dye mixture (D) to be introduced is selected from a range of 55 to 95% by weight, preferably 55 to 90% by weight based on total solid content (100% by weight) of resin (A), photoacid generator or photobase generator (B), crosslinking compound (C) and dye mixture (D). When the dye mixture is introduced in a small amount, it becomes difficult to realize desired spectral properties when resist coating is formed in a shape of thin film. On the other hand, when the dye mixture is introduced in a large amount, the resist composition does not exhibit suitable resolution.

Solvents (E) used in the resist composition according to the present invention are include for example acetone, methanol, ethanol, isopropylalcohol, methoxymethyl pentanol, dipentene, ethyl amyl ketone, methyl nonyl ketone, methyl ethyl ketone, methyl isoamyl ketone, methyl isopropyl ketone, methyl cellosove, ethyl cellosolve, methyl cellosolve acetate, ethyl cellosolve acetate, butyl carbitol, ethyl carbitol, ethylene glycol, ethylene glycol monoacetate, ethylene glycol monoisopropyl ether, ethylene glycol monobutyl ether, propylene glycol, propylene glycol monoacetate, propylene glycol monomethyl ether, propylene glycol-tert-butyl ether, dipropylene glycol monomethyl ether, diethylene glycol, diethylene glycol monoacetate, diethylene glycol dimethyl ether, dipropylene glycol monoacetate monomethyl ether, dipropylene glycol monomethyl ether, dipropylene glycol monoethyl ether, dipropylene glycol monoacetate monoethyl ether, dipropylene glycol monopropyl ether, dipropylene glycol monoacetate monopropyl ether, dipropylene glycol monopropyl ether, dipropylene glycol monoacetate monopropyl ether, 3-methyl-3-methoxybutyl acetate, tripropylene glycol methyl ether, 3-methyl-3-methoxybutanol, diisoproyl ether, ethyl isobutyl ether, diisobutylene, amyl acetate, butyl butyrate, butyl ether, diisobutyl ketone, methyl cyclohexene, propyl ether, dihexyl ether, dioxane, N,N-dimethyl acetamide, N,N-dimethylformamide, dimethyl sulfoxide, N-metylpyrrolidone, γ-butyrolactone, n-hexane, n-pentane, n-octane, diethyl ether, cyclohexanone, methyl lactate, ethyl lactate, methyl acetate, ethyl acetate, n-butyl acetate, propylene glycol monoethyl ether acetate, methyl pyruvate, ethyl pyruvate, 3-methoxy methyl propionate, 3-ethoxy methyl ethyl propionate, 3-methoxy ethyl propionate, 3-ethoxy propionate, 3-methoxy propionate, 3-methoxy propyl propionate, 3-methoxy butyl propionate, diglyme, 4-hydroxy4-methyl-2-pentanone and the like. These solvents may be used alone or a combination of two or more.

In the resist composition of the present invention, the content proportion of resin (A), photoacid generator or photobase generator (B), crosslinking compound (C) and dye mixture (D), that is, the solid content concentration is 5 to 50% by weight, preferably 10 to 30% by weight.

When the proportion is less than 5% by weight, the thickness of coating becomes too small to cause a problem of occurrence of pinholes or characteristic performance. On the other hand, when it is more than 50% by weight, the viscosity of the resist composition becomes too high to give rise to lack of uniformity in thickness of coating.

The resist composition of the present invention can contain surfactants in order to increase coatability of resist coating and surface evenness. As the surfactants, mention may be made of fluorine surfactants, silicone surfactants, nonionic surfactants and the like.

More concretely, the surfactants include for example EFTOP EF301, EF303 or EF352 (Tochem Products Co., Ltd.), MEGAFAC F171, F173 or R-30 (Dainippon Ink and Chemicals, Inc.), FLUORAD FC430 or FC431 (Sumitomo 3M Limited), ASAHI GUARD AG710, SURFLON S-382, SC101, SC102, SC103, SC104, SC105 or SC106 (Asahi Glass Co., Ltd.), etc.

The used proportion of the surfactants is preferably 0.01 to 2 parts by weight, more preferably 0.01 to 1 part by weight on the basis of 100 parts by weight of resin component. When the content of the surfactants is more than 2 parts by weight, the composition is liable to cause uneven resist coating. On the other hand, when the content is less than 0.01 part by weight, it is liable to cause striation in the resist coating.

In addition, in order to increase adhesion with a substrate after development, adhesion accelerators can be added. Concrete examples of the adhesion accelerators are for example chlorosilanes such as trimethylchlorosilane, dimethylvinylchlorosilane, methyldiphenylchlorosilane or chloromethyldimethyl-chlorosilane; alkoxysilanes such as trimethylmethoxysilane, dimethyldiethoxysilane, methyidimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxy-silane, γ-methacryloxy propyl trimethoxy silane, or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylene urea or 1,3-dimethylurea, or thiourea compounds.

The used proportion of the adhesion accelerators is generally 20 parts by weight or less, preferably 0.05 to 10 parts by weight, more preferably 1 to 10 parts by weight based on 100 parts by weight of the resin component (A).

The resist compositions of the present invention can contain further additives which have miscibility with the resist composition. The additives include for example UV light absorbers for increasing light resistance, antioxidants, or compatibilizing agents for inhibiting deposition of dyes. Concrete examples of compatibilizing agents for inhibiting deposition of dyes are alkyl ether compounds such as polyoxyethylene octyl ether compounds, polyoxyethylene lauryl ether compounds, polyoxyethylene alkyl (12-13 carbon atoms) ether compounds, polyoxyethylene secondary alkyl (12-14 carbon atoms) ether compounds, polyoxyethylene alkyl (13 carbon atoms) ether compounds, polyoxyethylene cetyl ether compounds, polyoxyethylene stearyl ether compounds, polyoxyethylene oleyl ether compounds, polyoxyethylene decyl ether compounds, polyoxyalkylene alkyl (11-15 carbon atoms) ether compounds, polyoxyalkylene secondary alkyl (12-14 carbon atoms) ether compounds or polyoxyalkylene cetyl ether compounds, alkyl amino ether compounds such as polyoxyethylene lauryl amino ether compounds, polyoxyethylene stearyl amino ether compounds or polyoxyethylene oleyl amino ether compounds, alkyl amido ether compounds such as polyoxyethylene lauric amide ether compounds, polyoxyethylene stearic amide ether compounds, polyoxyethylene oleic amide ether compounds, lauric diethanol amido compounds, stearic diethanol amido compounds or oleic diethanol amido compounds, allyl phenyl ether compounds such as polyoxyethylene polystyrphenyl ether compounds, polyoxyalkylene polystyrphenyl ether compounds, polyoxyalkylene polystyrphenyl ether formamide condensates, polyoxyethylene monostyryl phenyl ether compounds, polyoxyethylene distyryl phenyl ether compounds or polyoxyethylene naphthyl ether compounds, glycerin fatty acid ester compounds such as glycerin monolaurate compounds, glycerin monostearate compounds, glycerin monooleate compounds or glycerin trioleate compounds, sorbitan acid ester compounds such as sorbitan monolaurate compounds, sorbitan monopalmitate compounds, sorbitan monostearate compounds, sorbitan tristearate compounds, sorbitan monooleate compounds or sorbitan trioleate compounds, fatty acid ether ester compounds such as polyoxyethylene dilaurate compounds, polyoxyethylene laurate compounds, polyoxyethylene stearate compounds, polyoxyethylene distearate compounds, polyoxyethylene dioleate compounds or polyoxyethylene oleate compounds, vegetable oil ether ester compounds such as polyoxyethylene castor oil ether compounds or polyoxyethylene hardened castor oil ether compounds, sorbitan ether ester compounds such as polyoxyethylene sorbitan monolaurate compounds, polyoxyethylene sorbitan monostearate compounds, polyoxyethylene sorbitan monooleate compounds or polyoxyethylene sorbitan trioleate compounds, monool type polyether compounds such as polyoxyalkylene butyl ether compounds, polyoxyalkylene octyl ether compounds, polyoxyalkylene alkyl (14-15 carbon atoms) ether compounds or polyoxyalkylene oleyl ether compounds, diol type polyether compounds such as polyoxyethylene polyoxypropylene condensates, polyol type polyether compounds such as trimethylol propane tris(polyoxyalkylene) ether compounds or polyoxyalkylene glyceryl ether compounds, fatty acid alkyl ester compounds such as methyl laurate compounds, methyl oleate compounds, isopropyl myristate compounds, butyl stearate compounds, octyl palmitate compounds, octyl stearate compounds, lauryl oleate compounds, isotridecyl stearate compounds, oleyl oleate compounds, dioleyl adipate compounds, trimethylol propane tridecanoate compounds, trimethylol propane trilaurate compounds, pentaerythritol dioleate compounds, pentaerythritol monostearate compounds or pentaerythritol distearate compounds, sulfonic acid type compounds, alkylsulfonate compounds, long-chain alkylbenzene sulfonic acid compounds, branched alkylbenzene sulfonic acid compounds, long-chain alkylbenzene sulfonate compounds, branched alkylbenzene sulfonate compounds, branched alkyldiphenyl ether disulfonate compounds, monoisopropyl naphthalene sulfonate compounds, diisopropyl naphthalene sulfonate compounds, triisopropyl naphthalene sulfonate compounds, dibutyl naphthalene sulfonate compounds or dioctyl sulfosuccinate compounds, sulfate type compounds such as oleic acid sulfated oil compounds, castor oil sulfated compounds, octyl sulfate compounds, lauryl sulfate compounds, alkyl sulfate compounds or alkyl ether sulfate compounds, cellulose, cellulose derivatives, polysaccharide compounds and the like.

The used proportion of these compatibilizing agents is 0.001 to 20 parts by weight based on 100 parts by weight of resin component (A). When the proportion is low, the resulting composition is inferior in a property of inhibiting deposition of dye to one containing it in a high proportion. When the proportion is high, it becomes difficult to obtain a good pattern shape. However, the compatibilizing agent can be used in an amount of 20 parts by weight or more so long as it does not inhibit a pattern shape.

Next, methods of producing color filters by using the dye-containing negative type resist composition for color filter according to the present invention are described.

The dye-containing negative type resist composition of the present invention is coated on a silicon wafer or a glass substrate by spin-coating method or the like in a number of revolution so as to a desired resist thickness, and soft-baked (calcined). In the soft-baking, it is necessary to vaporize the solvent, and it is preferably carried out at a temperature of 50 to 150° C. for 30 seconds to 10 minutes. Thereafter, exposure is carried out through a mask in an exposure of about 100 to 2,000 mJ/cm$^2$. For the exposure, UV light such as mercury vapor lamp, far UV light, electron rays, X-rays and the like are used for example. After exposure, when a negative type pattern is formed by using the dye-containing negative type resist composition, heating (post exposure bake (PEB)) is preferably performed. By performing PEB, crosslinking by an acid or base generated with exposure further proceeds, and difference of solubility in developer between an exposed part and an unexposed part becomes larger, thereby a contrast is increased. PEB is preferably performed at a temperature of 50 to 150° C. for 30 seconds to 5 minutes.

Subsequently, developing is performed. Methods of developing are not specifically limited, and well known methods such as paddle method, dip method, spray method and the like can be used. It is preferable that the temperature for developing ranges from 20° C. to 30° C. and that the time of dipping in developer is 10 seconds to 10 minutes.

As developer, organic solvents or alkaline aqueous solutions, etc. can be used. Concretely, the developer includes isopropyl alcohol, propylene glycol monomethyl ether, an aqueous solution of ethyl amine, an aqueous solution of n-propylamine, an aqueous solution of diethylamine, an aqueous solution of di-n-propylamine, an aqueous solution of triethylamine, an aqueous solution of methyldiethylamine, an aqueous solution of diethanol amine, an aqueous solution of triethanol amine, an aqueous solution of tetramethyl ammonium hydroxide, an aqueous solution of sodium hydroxide, an aqueous solution of potassium hydroxide, an aqueous solution of sodium carbonate, an aqueous solution of sodium bicarbonate, an aqueous solution of sodium silicate or an aqueous solution of sodium metasilicate, etc.

In order to increase a performance of removing unexposed parts, it is preferable to add surfactants. Concrete examples thereof are alkyl ether compounds such as polyoxyethylene octyl ether compounds, polyoxyethylene lauryl ether compounds, polyoxyethylene alkyl (12-13 carbon atoms) ether compounds, polyoxyethylene secondary alkyl (12-14 carbon atoms) ether compounds, polyoxyethylene alkyl (13 carbon atoms) ether compounds, polyoxyethylene cetyl ether compounds, polyoxyethylene stearyl ether compounds, polyoxyethylene oleyl ether compounds, polyoxyethylene decyl ether compounds, polyoxyalkylene alkyl (11-15 carbon atoms) ether compounds, polyoxyalkylene secondary alkyl (12-14 carbon atoms) ether compounds or polyoxyalkylene cetyl ether compounds, alkyl amino ether compounds such as polyoxyethylene lauryl amino ether compounds, polyoxyethylene stearyl amino ether compounds or polyoxyethylene oleyl amino ether compounds, alkyl amido ether compounds such as polyoxyethylene lauric amide ether compounds, polyoxyethylene stearic amide ether compounds, polyoxyethylene oleic amide ether compounds, lauric diethanol amido compounds, stearic diethanol amido compounds or oleic diethanol amido compounds, allyl phenyl ether compounds such as polyoxyethylene polystyrphenyl ether compounds, polyoxyalkylene polystyrphenyl ether compounds, polyoxyalkylene polystyrphenyl ether formamide condensates, polyoxyethylene monostyryl phenyl ether compounds, polyoxyethylene distyryl phenyl ether compounds or polyoxyethylene naphthyl ether compounds, glycerin fatty acid ester compounds such as glycerin monolaurate compounds, glycerin monostearate compounds, glycerin monooleate compounds or glycerin trioleate compounds, sorbitan acid ester compounds such as sorbitan monolaurate compounds, sorbitan monopalmitate compounds, sorbitasn monostearate compounds, sorbitan tristearate compounds, sorbitan monooleate compounds or sorbitan trioleate compounds, fatty acid ether ester compounds such as polyoxyethylene dilaurate compounds, polyoxyethylene laurate compounds, polyoxyethylene stearate compounds, polyoxyethylene distearate compounds, polyoxyethylene dioleate compounds or polyoxyethylene oleate compounds, vegetable oil ether ester compounds such as polyoxyethylene castor oil ether compounds or polyoxyethylene hardened castor oil ether compounds, sorbitan ether ester compounds such as polyoxyethylene sorbitan monolaurate compounds, polyoxyethylene sorbitan monostearate compounds, polyoxyethylene sorbitan monooleate compounds or polyoxyethylene sorbitan trioleate compounds, mono-ol type polyether compounds such as polyoxyalkylene butyl ether compounds, polyoxyalkylene octyl ether compounds, polyoxyalkylene alkyl (14-15 carbon atoms) ether compounds or polyoxyalkylene oleyl ether compounds, diol type polyether compounds such as polyoxyethylene polyoxypropylene condensates, polyol type polyether compounds such as trimethylol propane tris(polyoxyalkylene) ether compounds or polyoxyalkylene glyceryl ether compounds, fatty acid alkyl ester compounds such as methyl laurate compounds, methyl oleate compounds, isopropyl myristate compounds, butyl stearate compounds, octyl palmitate compounds, octyl stearate compounds, lauryl oleate compounds, isotridecyl stearate compounds, oleyl oleate compounds, dioleyl adipate compounds, trimethylol propane tridecanoate compounds, trimethylol propane trilaurate compounds, pentaerythritol dioleate compounds, pentaerythritol monostearate compounds or pentaerythritol distearate compounds, sulfonic acid type compounds such as alkylsulfonate compounds, long-chain alkylbenzene sulfonic acid compounds, branched alkylbenzene sulfonic acid compounds, long-chain alkylbenzene sulfonate compounds, branched alkylbenzene sulfonate compounds, branched alkyldiphenyl ether disulfonate compounds, monoisopropyl naphthalene sulfonate compounds, diisopropyl naphthalene sulfonate compounds, triisopropyl naphthalene sulfonate compounds, dibutyl naphthalene sulfonate compounds or dioctyl sulfosuccinate compounds, sulfate type compounds such as oleic acid sulfated oil compounds, castor oil sulfated compounds, octyl sulfate compounds, lauryl sulfate compounds, alkyl sulfate compounds or alkyl ether sulfate compounds, and the like. The preferable concentration of the alkaline developer is 0.001 to 10% by weight of the alkaline component and 0.001 to 10% by weight of the surfactant component. When the concentration of the alkaline component is too high, the developer permeates into even unexposed parts in the negative type, thereby causing unevenness of pattern surface. On the other hand, the developer having too law concentration of the alkaline component does not exhibit developing capacity. Further, when the concentration of the surfactant component is too high, the developer is apt to occur bubbling and to cause uneven development. On the other hand, the developer having too law concentration of the surfactant component does not exhibit developing capacity.

After developing, it is preferable to rinse with water or conventional organic solvents. Thereafter, a pattern is formed by drying. In case where the negative type resist composition according to the present invention is used, exposed parts are hardened and unexposed parts are dissolved out to form a negative pattern.

A sequence of the above-mentioned processes is repeated necessary times by changing color and mask to form colored pattern in which necessary colors are combined. In addition, after forming a pattern, heat (post bake) may be performed in order to subject functional groups that remain in the pattern and can be polymerized or condensed to complete reaction. The post bake may be performed for each process for forming each color or after the completion of forming all colored patterns. It is preferably performed at a temperature ranging from 150 to 500° C. for 30 minutes to 2 hours.

EXAMPLES

Preparation of Dye-Containing Negative Type Resist Composition

Resin A1: VP 8000 (trade name, manufactured by Nippon Soda Co., Ltd.), polyvinyl phenol, weight average molecular weight 8,000 (in term of polystyrene);

Resin A2: Maruka Lyncur CHM (trade name, polymer of vinylphenol/2-hydroxyethyl methacrylate in 50 parts by weight/50 parts by weight) (manufactured by Maruzen Petrochemical Co., Ltd.), weight average molecular weight 10,000 (in term of polystyrene);

Resin A3: polymer of vinylphenol/hydroxyethyl methacrylate/methyl methacrylate in 70 parts by weight/20 parts by weight/10 parts by weight, weight average molecular weight: 6,000 (in term of polystyrene);

Resin A4: polymer of vinylphenol/styrene in 80 parts by weight/20 parts by weight, weight average molecular weight: 9,000 (in term of polystyrene);

Resin A5: polymer of m-cresol/p-cresol in 50 parts by weight/50 parts by weight, weight average molecular weight: 8,000.

Resin A6: polymer of methyl methacrylate/hydroxyethyl methacrylate/methacrylic acid/benzyl methacrylate in 20 parts by weight/20 parts by weight/15 parts by weight/45 parts by weight, weight average molecular weight: 9,000 (in term of polystyrene), degree of dispersion: 2.0;

Photoacid generator B1: compound of formula (80) manufactured by Ciba Specialty Chemicals

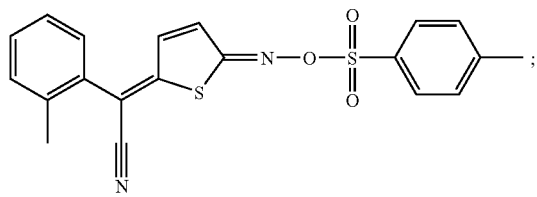

Photoacid generator B2: compound of formula (81) manufactured by Midori Kagaku Co., Ltd.

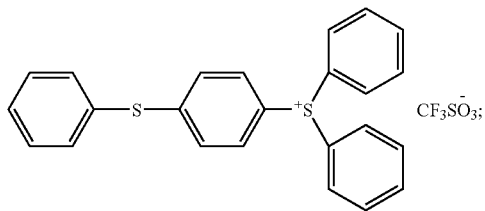

Photoacid generator B3: trade name TAZ107 of formula (82) manufactured by Midori Kagaku Co., Ltd.

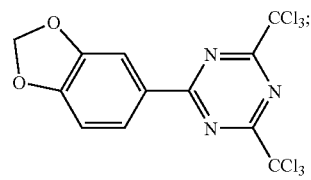

Photoacid generator B4: trade name TAZ110 of formula (83) manufactured by Midori Kagaku Co., Ltd.

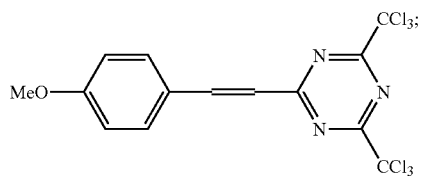

Crosslinking compound C1: Cymel 303 (trade name, hexamethoxymethylmelamine); Crosslinking compound C2: Powderlink 1174 (trade name, methoxymethylolated glycoluril);

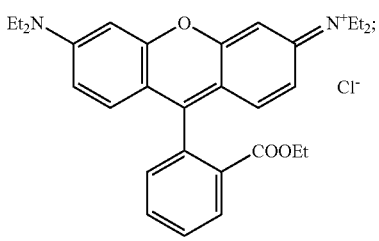

Dye D1: compound of formula (84)
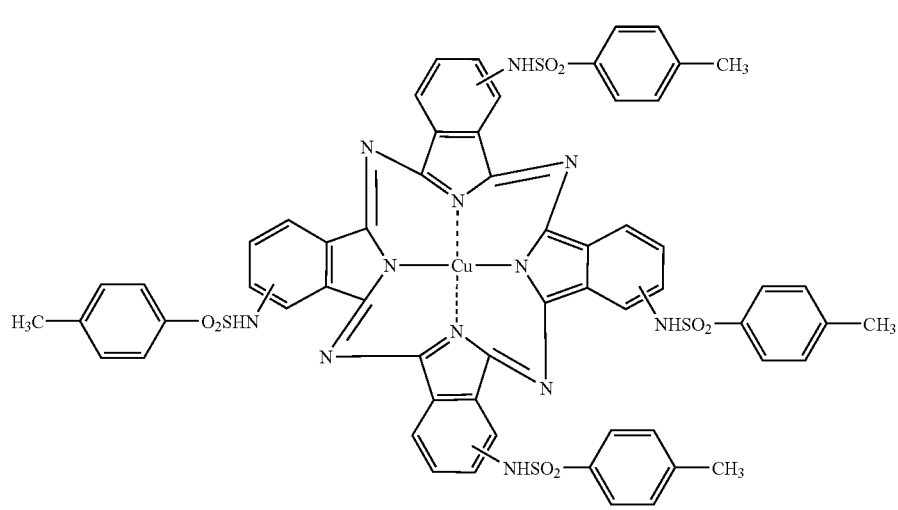
Dye D2: compound of formula (85)
The compound is a mixture of ones with 2 to 4 substituents.
Dye D3: compound of formula (86)
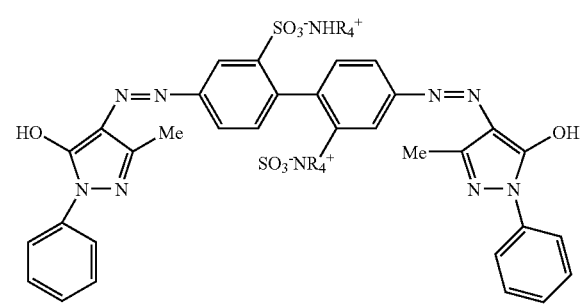
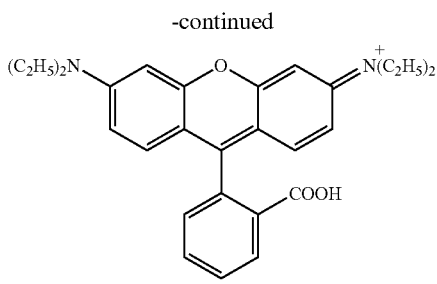
Dye D4: compound of formula (87)
Dye D5: compound of formula (88)
The compound is a mixture of ones with 2 to 4 substituents.

Example 1

In a 20 ml sample tube, 1.0 g of resin (A1), 0.53 g of dye (D1), 1.6 g of dye (D2), 0.3 g of crosslinking compound (C1), 0.3 g of photoacid generator (B3), 3.3 g of propylene glycol monomethyl ether and 7.70 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. The composition contained no insoluble matter in solution and was a homogeneous solution. A part of the resulting resist composition was filtered through a 0.2 μm filter, and the resulting filtrate was coated on a silicon wafer of 4-inch so that a coating with film thickness 1.0 μm can be obtained, and contact-baked at 120° C. for 1 minute on a hot plate. The resulting wafer was exposed to light at 200 mJ/cm$^2$ by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 3 μm-square pattern. The optical quality was as follows: in wavelength between 400 nm and 700 nm, a region in wavelength of 560 nm to 690 nm showed a transmittance of 10% or less and a region in wavelength of 420 nm to 490 nm showed a transmittance of 70% or more.

In addition, after heat resistance test at 220° C. for 30 minutes, a variation in transmittance at the top peak of 450 nm was 3%.

The blue resist composition contained a mixed dye of dye (D1) and dye (D2) in Example 1, and dye (D2) itself contained dye substituted with amino sulfonate ester in 95% and dye substituted with sulfonic acid or sodium sulfonate in 5%. Therefore, the dye mixture contained dye molecules having amino sulfonate ester structure in 76% based on total dye composed of D1 and D2. In the resulting blue resist composition, dye (D1) and dye (D2) were fully dissolved and were not crystallized, and no foreign matter (particle) occurred.

Example 2

In a 20 ml sample tube, 1.0 g of resin (A2), 2.70 g of dye (D3), 0.40 g of crosslinking compound (C1), 0.15 g of photoacid generator (B4), 4.00 g of propylene glycol monomethyl ether and 9.00 g of 4-hydroxy4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. The composition contained no insoluble matter in solution and was a homogeneous solution. A part of the resulting resist composition was filtered through a 0.2 μm filter, and the resulting filtrate was coated on a silicon wafer of 4-inch so that a coating with film thickness 1.0 μm can be obtained, and contact-baked at 120° C. for 1 minute on a hot plate. The resulting wafer was exposed to light at 200 mJ/cm$^2$ by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 2 μm-square pattern. The optical quality was as follows: in wavelength between 400 nm and 700 nm, a region in wavelength of 400 nm to 460 nm showed a transmittance of 10% or less and a region in wavelength of 500 nm to 700 nm showed a transmittance of 70% or more.

In addition, after heat resistance test at 220° C. for 30 minutes, a variation in transmittance at the top peak of 600 nm was 4%.

The yellow resist composition contained dye (D3) in Example 2, and dye (D3) itself contained dye substituted with ammonium sulfonate in 93% and dye substituted with sulfonic acid or sodium sulfonate in 7%. Therefore, the dye mixture contained dye molecules having ammonium sulfonate structure in 93% based on total dye. In the resulting yellow resist composition, dye (D3) was fully dissolved and was not crystallized, and no foreign matter (particle) occurred.

Example 3

In a 20 ml sample tube, 1.0 g of resin (A3), 1.0 g of dye (D3), 2.0 g of dye (D4), 0.1 g of crosslinking compound (C1), 0.7 g of photoacid generator (B2), and 16 g of ethyl lactate were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. The composition contained no insoluble matter in solution and was a homogeneous solution. A part of the resulting resist composition was filtered through a 0.2 μm filter, and the resulting filtrate was coated on a silicon wafer of 4-inch so that a coating with film thickness 1.0 pm can be obtained, and contact-baked at 120° C. for 1 minute on a hot plate. The resulting wafer was exposed to light at 100 mJ/cm$^2$ by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 1 μm-square pattern. The optical quality was as follows: in wavelength between 400 nm and 700 nm, regions in wavelength of 400 nm to 435 nm and of 650 nm to 690 nm showed a transmittance of 10% or less and a region in wavelength of 500 nm to 550 nm showed a transmittance of 70% or more.

In addition, after heat resistance test at 220° C. for 30 minutes, a variation in transmittance at the top peak of 530 nm was 2%.

The red resist composition contained a mixed dye of dye (D3) and dye (D4) in Example 3, and dye (D3) itself contained dye substituted with ammonium sulfonate in 93% and dye substituted with sulfonic acid or sodium sulfonate in 7%, and further dye (D4) itself contained dye substituted with ammonium sulfonate in 90% and dye substituted with sulfonic acid or sodium sulfonate in 10%. Therefore, the dye mixture contained dye molecules having ammonium sulfonate structure in 91% based on total dye composed of D3 and D4. In the resulting blue resist composition, dye (D3) and dye (D4) were fully dissolved and were not crystallized, and no foreign matter (particle) occurred.

Example 4

In a 20 ml sample tube, 1.0 g of resin (A4), 0.53 g of dye (D1), 1.7 g of dye (D5), 0.4 g of crosslinking compound (C1), 0.1 g of crosslinking compound (C2), 0.3 g of photoacid generator (B1), 6.30 g of propylene glycol monomethyl ether and 6.30 g of ethyl lactate were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. The composition contained no insoluble matter in solution and was a homogeneous solution. A part of the resulting resist composition was filtered through a 0.2 μm filter, and the resulting filtrate was coated on a silicon wafer of 4-inch so that a coating with film thickness 1.0 μm can be obtained, and contact-baked at 120° C. for 1 minute on a hot plate. The resulting wafer was exposed to light at 400 mJ/cm$^2$ by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 3 μm-square pattern. The optical quality was as follows: in wavelength between 400 nm and 700 nm, a region in wavelength of 540 nm to 640 nm showed a transmittance of 10% or less and a region in wavelength of 430 nm to 480 nm showed a transmittance of 70% or more.

In addition, after heat resistance test at 220° C. for 30 minutes, a variation in transmittance at the top peak of 450 nm was 2%.

The blue resist composition contained a mixed dye of dye (D1) and dye (D5) in Example 4, and dye (D5) itself contained dye substituted with amino sulfonate ester in 92% and dye substituted with sulfonic acid or sodium sulfonate in 8%. Therefore, the dye mixture contained dye molecules having amino sulfonate ester structure in 74% based on total dye composed of D1 and D5. In the resulting blue resist composition, dye (D1) and dye (D5) were fully dissolved and were not crystallized, and no foreign matter (particle) occurred.

Comparative Example 1

In a 20 ml sample tube, 1.0 g of resin (A5), 1.0 g of dye (D3), 0.4 g of dye (D2), 0.3 g of crosslinking compound (C1), 0.3 g of photoacid generator (B3), 3.3 g of propylene glycol monomethyl ether and 7.70 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. The composition contained no insoluble matter in solution and was a homogeneous solution. A part of the resulting resist composition was filtered through a 0.2 μm filter, and the resulting filtrate was coated on a silicon wafer of 4-inch so that a coating with film thickness 1.0 μm can be obtained, and contact-baked at 120° C. for 1 minute on a hot plate. The resulting wafer was exposed to light at 200 mJ/cm$^2$ by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 3 μm-square pattern. The optical quality was as follows: in wavelength between 400 nm and 700 nm, a region in wavelength of 550 nm to 570 nm showed a transmittance of 10% or less and a region in wavelength of 410 nm to 480 nm showed a transmittance of 70% or more.

However, after heat resistance test at 220° C. for 30 minutes, the top peak of 450 nm was lowered by 40% and no region showing a transmittance of 70% or more was observed.

Comparative Example 2

In a 20 ml sample tube, 1.0 g of resin (A1), 2.7 g of dye (D3), 0.40 g of crosslinking compound (C1), 0.15 g of photoacid generator (B3), 4.00 g of propylene glycol monomethyl ether and 9.00 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. Immediately after the production thereof, the composition contained no insoluble matter in solution and was a homogeneous solution.

The yellow resist composition contained dye (D3) in Comparative Example 2, and dye (D3) itself contained dye substituted with ammonium sulfonate in almost 100%, obtained by repeating recrystallization of dye (D3). Therefore, the dye mixture contained dye molecules having ammonium sulfonate structure in 100% based on total dye. In the resulting yellow resist composition, dye (D3) was fully dissolved, but 30 days after reservation, the molecules of dye (D3) were crystallized in the yellow resist composition, and foreign matter (particle) occurred. Due to the occurrence of the foreign matter (particles), the pattern obtained from the resist composition had many holes and the resolution was about 10 μm.

Comparative Example 3

In a 20 ml sample tube, 1.0 g of resin (A1), 2.8 g of dye (D2), 0.40 g of crosslinking compound (C1), 0.15 g of photoacid generator (B3), 4.00 g of propylene glycol monomethyl ether and 9.00 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. Immediately after the production thereof, the composition contained no insoluble matter in solution and was a homogeneous solution.

The resist composition contained dye (D2) in Comparative Example 3, and dye (D2) itself contained amino sulfonate ester in almost 100%, obtained by repeating recrystallization of dye (D2). Therefore, the dye mixture contained dye molecules having amino sulfonate ester structure in 100% based on total dye. In the resulting resist composition, dye (D2) was fully dissolved, but 30 days after reservation, the molecules of dye (D2) were crystallized in the yellow resist composition, and foreign matter (particle) occurred. Due to the occurrence of the foreign matter (particles), the pattern obtained from the resist composition had many holes and the resolution was about 10 μm.

Comparative Example 4

In a 20 ml sample tube, 1.0 g of resin (A6), 1.76 g of dye (D1), 0.95 g of dye (D3), 0.40 g of crosslinking compound (C1), 0.15 g of photoacid generator (B3), 4.00 g of propylene glycol monomethyl ether and 9.00 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. Immediately after the production thereof, the composition contained no insoluble matter in solution and was a homogeneous solution.

The resist composition contained a mixed dye of dye (D1) and dye (D3) in Comparative Example 4, and dye (D3) itself contained dye substituted with ammonium sulfonate in 93% and sulfonic acid or dye substituted with sulfonic acid or sodium sulfonate in 7%. Therefore, the dye mixture contained dye molecules having ammonium sulfonate structure in 32.6% based on total dye composed of D1 and D3. This resulting resist composition was coated on a silicon wafer of 4-inch so that a coating with film thickness 1.0 μm can be obtained, and contact-baked at 120° C. for 1 minute on a hot plate. The resulting wafer was exposed to light at 100 mJ/cm² by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 1 μm-square pattern. The optical quality was as follows: in wavelength between 400 nm and 700 nm, a region in wavelength of 580 nm to 700 nm showed a transmittance of 70% or more and a region in wavelength of 400 nm to 460 nm showed a transmittance of 15%.

In addition, after heat resistance test at 220° C. for 30 minutes, a region in wavelength of 400 nm to 460 nm showed a transmittance of 25% or more.

Comparative Example 5

In a 20 ml sample tube, 1.0 g of resin (A6), 1.8 g of dye (D1), 0.95 g of dye (D2), 0.40 g of crosslinking compound (C1), 0.15 g of photoacid generator (B3), 4.00 g of propylene glycol monomethyl ether and 9.00 g of 4-hydroxy-4-methyl-2-pentanone were added and stirred at room temperature. Then, as surfactant 0.009 g of Megafac R-30 (trade name, manufactured by Dainippon Ink and Chemicals, Inc.) was added thereto, further stirred at room temperature to obtain a resist composition. Immediately after the production thereof, the composition contained no insoluble matter in solution and was a homogeneous solution.

The resist composition contained a mixed dye of dye (D1) and dye (D2) in Comparative Example 5, and dye (D2) itself contained dye substituted with amino sulfonate ester in 95% and dye substituted with sulfonic acid or sodium sulfonate in 5%. Therefore, the dye mixture contained dye molecules having amino sulfonate ester structure in 32.8% based on total dye composed of D1 and D2.

This resulting resist composition was coated on a silicon wafer of 4-inch so that a coating with film thickness 1.0 μm can be obtained, and contact-baked at 120° C. for 1 minute on a hot plate. The resulting wafer was exposed to light at 100 mJ/cm² by use of Aligner exposure apparatus (trade name: PLA 600S, manufactured by Canon Inc.), and thereafter heated at baking temperature of 140° C. for 1 minute. Then, the resulting wafer was developed in PSC developer (manufactured by Brewer Science Inc., tetramethyl ammonium hydroxide containing surfactant) being a developer containing surfactant for 80 seconds to obtain a pattern. An observation with SEM showed that the pattern was 1 μm-square pattern. The optical quality was as follows: in wavelength between 400 nm and 700 nm, a region in wavelength of 430 nm to 490 nm showed a transmittance of 70% or more and a region in wavelength of 550 nm to 650 nm showed a transmittance of 20% or more.

In addition, after heat resistance test at 220° C. for 30 minutes, the top peak at wavelength 450 nm was lowered by 20%, and further a region in wavelength of 550 nm to 650 nm showed a transmittance of 30% or more.

INDUSTRIAL APPLICABILITY

Color filters are produced through the steps: applying the resist composition provided according to the present invention on a substrate, drying, exposing and developing. The color filters are applicable for a liquid crystal display device, a LED display device, or a solid-state image sensing device such as a charge coupled device (CCD) or the like.

What is claimed is:

1. Method of producing a color filter comprising the steps of:

coating a resist composition on a substrate;

drying;

exposing; and developing, wherein the resist composition comprises a resin selected from the group consisting of polyvinyl phenol or a copolymer thereof, at least one of a photoacid generator or a photobase generator, a crosslinking compound and a dye mixture containing a dye having a structure of amino sulfonate ester or ammonium sulfonate salt in a proportion of 40 to 95% by weight of total dye content, and the dye mixture is contained in the resist composition in an amount of 55 to 95% by weight based on total solid content of the resist composition, the resist composition has an optical quality having at least a region with a transmittance of 70% or more and a region with a transmittance of 10% or less in wavelength range between 400 nm and 700 nm, and in which a variation in transmittance is 5% or less even when the composition is subjected to a temperature of 200° C. or more, and the dye having a structure of amino sulfonate ester or ammonium sulfonate salt is a dye selected from the group consisting of:

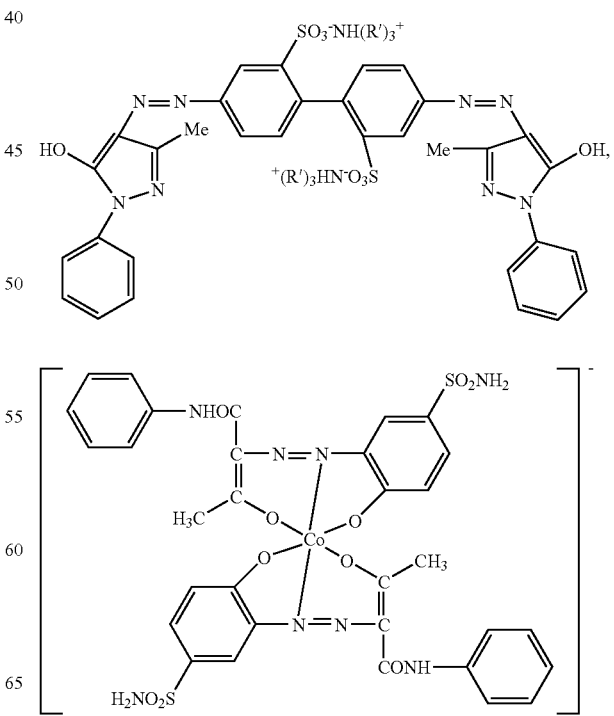

-continued
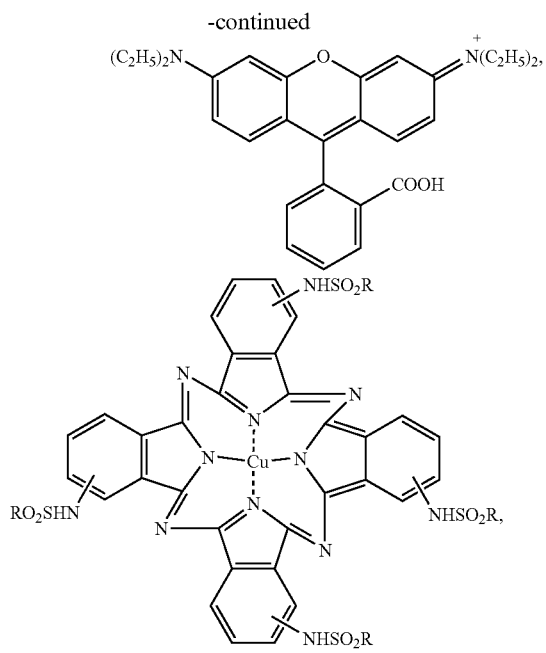
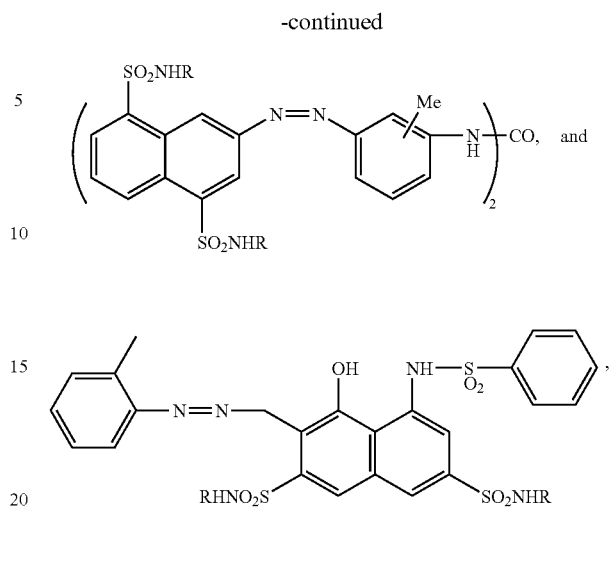
wherein R is an alkyl or aromatic group and R' is a hydrogen atom or an alkyl group.
* * * * *